(12) United States Patent
Tan et al.

(10) Patent No.: US 8,791,007 B2
(45) Date of Patent: Jul. 29, 2014

(54) DEVICE HAVING MULTIPLE WIRE BONDS FOR A BOND AREA AND METHODS THEREOF

(75) Inventors: Gin Ghee Tan, Bayan Lepas (MY); Lai Beng Teoh, Ayer Item (MY); Royce Yeoh Kao Tziat, Bayan Lepas (MY); Sally Yin Lye Foong, Milpitas, CA (US)

(73) Assignee: Spansion LLC, Sunnyvale, CA (US)

( * ) Notice: Subject to any disclaimer, the term of this patent is extended or adjusted under 35 U.S.C. 154(b) by 268 days.

(21) Appl. No.: 13/306,390

(22) Filed: Nov. 29, 2011

(65) Prior Publication Data

US 2013/0134578 A1   May 30, 2013

(51) Int. Cl.
*H01L 21/44* (2006.01)
(52) U.S. Cl.
USPC .................. 438/613; 257/737; 257/E21.158; 257/E23.068

(58) Field of Classification Search
USPC ............ 257/737, E21.158, E23.068; 438/613
See application file for complete search history.

(56) References Cited

U.S. PATENT DOCUMENTS

| 7,064,433 B2 | 6/2006 | Wong et al. |
| 7,285,854 B2 * | 10/2007 | Ishikawa et al. .............. 257/738 |
| 2010/0019392 A1 | 1/2010 | Ghee et al. |
| 2010/0102424 A1 | 4/2010 | Onodera et al. |

* cited by examiner

*Primary Examiner* — Elias M Ullah
(74) *Attorney, Agent, or Firm* — Sterne, Kessler, Goldstein & Fox PLLC

(57) ABSTRACT

Wire bonds are formed at an integrated circuit device so that multiple wires are bonded to a single bond pad. In a particular embodiment, the multiple wires are bonded by first applying a stud bump to the pad and successively bonding each of the wires to the stud bump. Another stud bump can be placed over the bonded wires to provide additional connection security.

15 Claims, 6 Drawing Sheets

DEVICE HAVING MULTIPLE WIRE BONDS FOR A BOND AREA AND METHODS THEREOF

FIELD OF THE DISCLOSURE

This disclosure, in general, relates to electronic devices and more particularly to electronic devices having wire bonds.

BACKGROUND

Electronic devices allow consumers access to a wide variety of applications and services for consumers, including communication, work enhancement, and entertainment applications and services. To facilitate provision of these applications and services, electronic devices have become increasingly complex and implemented with increasingly smaller form factors. The increase in complexity and reduction in size of these devices can impose constraints on the electronic device's constituent parts. For example, reduction in size of an electronic device provides less area for the packaging of the device's integrated circuits.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

FIGS. 1-8 illustrate techniques for forming wire bonds at an integrated circuit device so that multiple wires are bonded to a single bond pad. In a particular embodiment, after formation of a die including the bond pad, the multiple wires are bonded by first applying a stud bump to the pad and successively bonding each of the wires to the stud bump. Another stud bump can be placed over the bonded wires to provide additional connection security. By bonding multiple wires to a single pad, the length of the wire connecting the bond pads can be reduced relative to conventional approaches that employ a single wire bond per pad. Reduction of the length of connecting wire can enhance signal integrity and reduce the footprint of the integrated circuit package.

Figure 1:
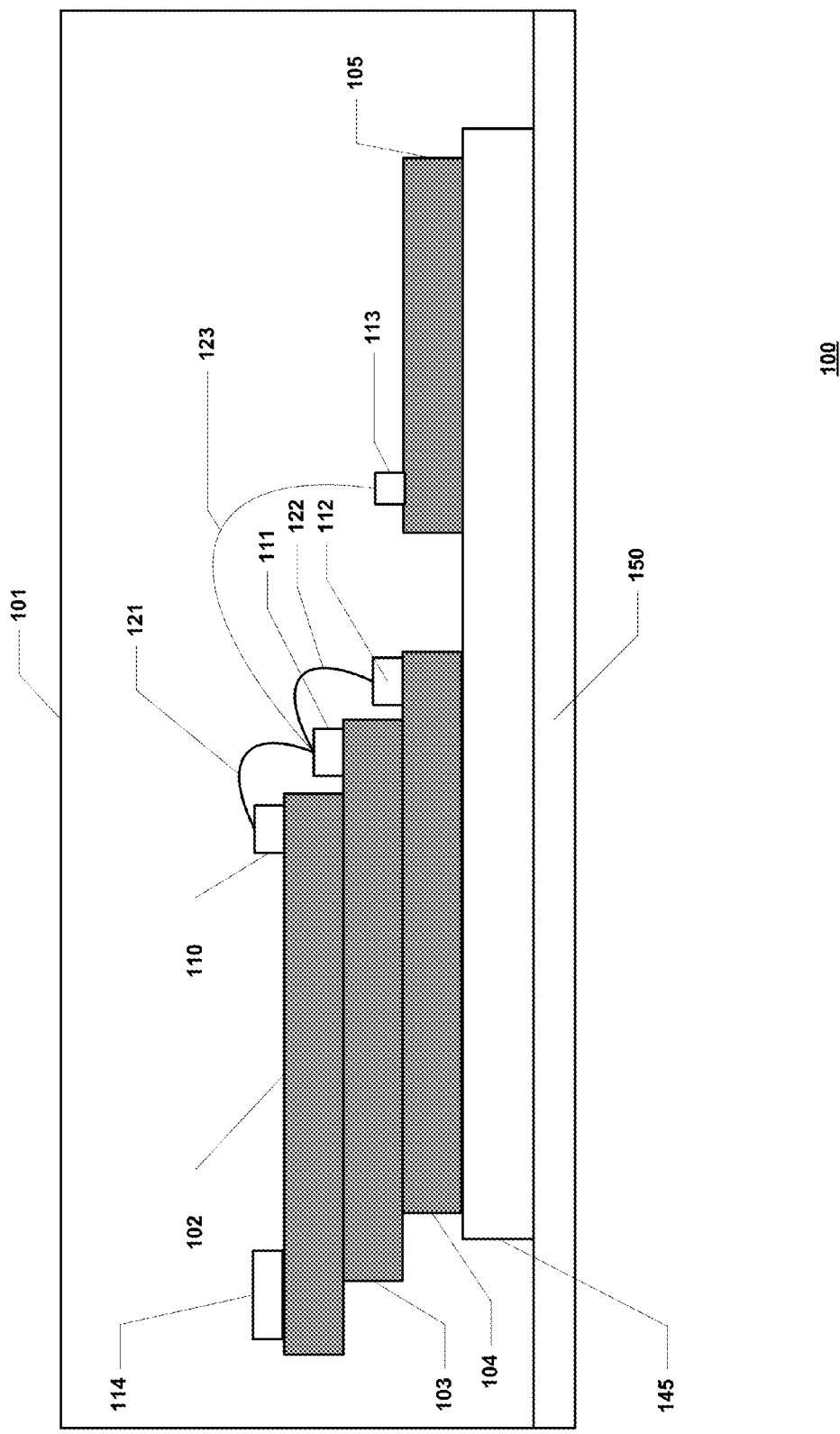
FIG. 1 is a block diagram of a cross-section of an integrated circuit device in accordance with one embodiment of the present disclosure.
Figure 2:
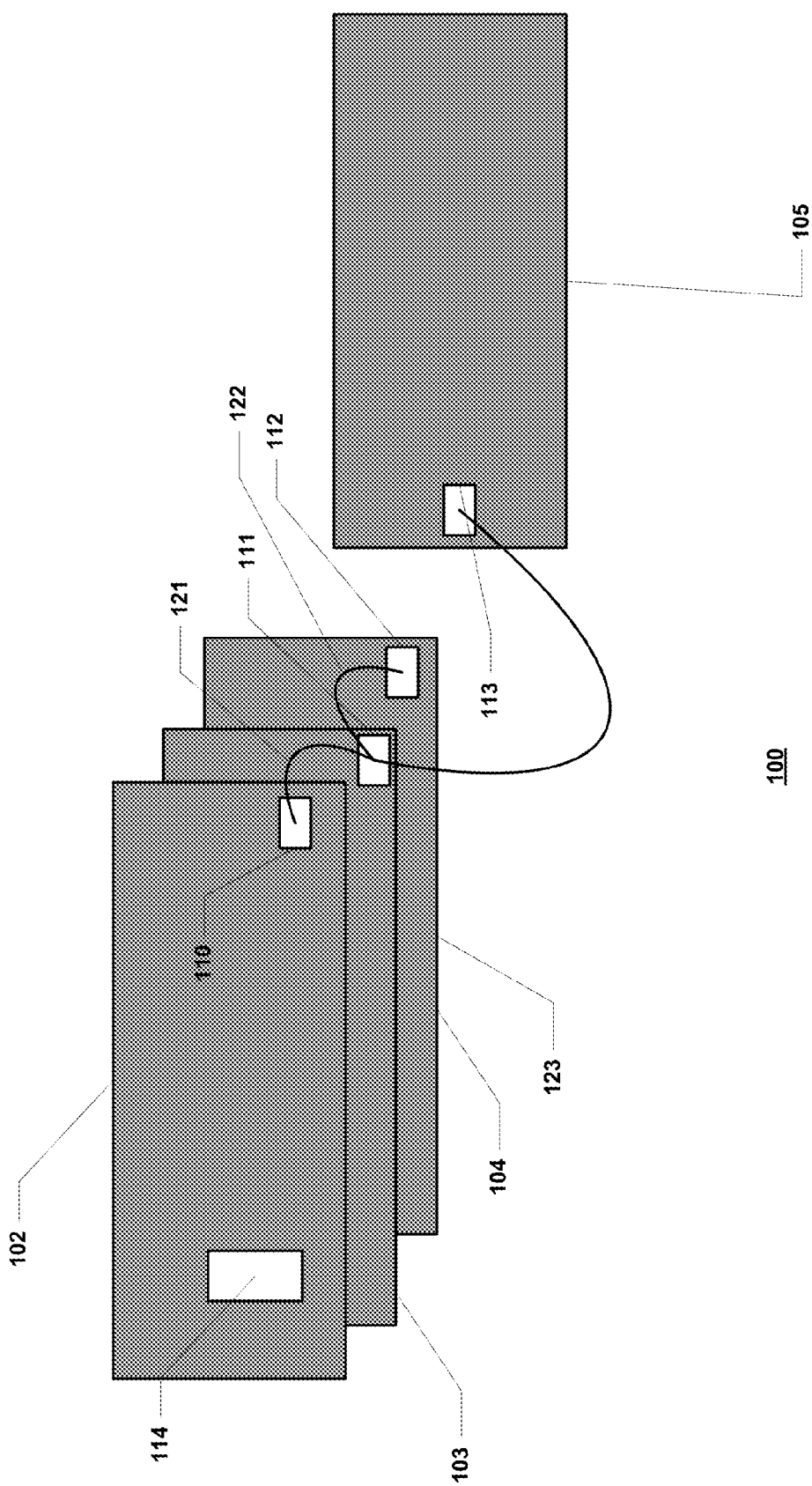
FIG. 2 is a block diagram of a top view of the integrated circuit device of FIG. 1 in accordance with one embodiment of the present disclosure.

FIG. 1 illustrates a side view of a cross-section of an integrated circuit device 100. The integrated circuit device includes and encapsulation package 101, semiconductor dies 102-105, a wire bond die 145, and a substrate 150. The semiconductor dies 102-104 are arranged in a stacked die arrangement disposed atop the wire bond die 145. The semiconductor die 105 is arranged laterally to the semiconductor die 105 and is disposed atop the wire bond die 145. The wire bond die 145 is attached to the substrate 150. The encapsulation package 101 encloses the semiconductor dies 102-105, the wire bond die 145, and the substrate 150 such that the integrated circuit device 100 forms an integrated circuit package. FIG. 2 illustrates a top view of a portion of the integrated circuit device 100, and in particular illustrates a top view of the semiconductor dies 102-105 and the associated wires and wire bonds.

In an embodiment, one or more of the dies 102-105 is a substrate, such as a printed circuit board, a leadframe, or other portion of an integrated circuit device. Each of the dies 102-105 includes a corresponding one of bond pads 110-113. In particular, die 102 includes a bond pad 110, die 103 includes bond pad 111, die 104 includes bond pad 112 and die 104 includes bond pad 113. In addition, die 102 includes a double-sized bond pad 114. In an embodiment, each of the bond pads 110-114 is a metalized site of the corresponding semiconductor die. The double-sized bond pad 114 is approximately twice the size of the bond pads 110-113. In an embodiment the bond pads 110-113 are substantially the same size.

It will be appreciated that FIGS. 1 and 2 illustrate only one possible arrangement of dies 102-105. In other embodiments, for example, one or more of the dies are not placed on top of the substrate 150, but instead are placed directly over an integrated circuit package, a chip carrier, a lead frame, ceramic material, a molded part, a laminate surface, and the like. Further, the bond pads 110-113 do not have to be formed at the illustrated dies. Instead, one or more of the bond pads 110-113, such as bond pad 113, can be located on a bond finger, a trace, a lead finger on a chip carrier, and the like. In addition, FIG. 1 illustrates an example of a chip scale package, but the device 100 could also be a thin small-outline package (TSOP), a quad flat no-lead (QFN) package, a multi-chip package (MCP), a system in a package (SIP), or other type of integrated circuit package.

In the illustrated embodiment, wires are attached to each of the bond pads 110-113 to provide electrical connections between the pads. In particular, wire 121 is bonded to bond pads 110 and 111, wire 122 is bonded to bond pads 111 and 112, and wire 123 is bonded to bond pads 111 and 113. Materials used to form the wires 121-123 can include gold (Au), aluminum (Al), silver (Ag), copper (Cu), or other material capable of providing an electrical connection between bond pads. FIG. 2 illustrates a top view of the integrated circuit device 100, providing another view of the dies 102-105, the bond pads 110-113, and the wires 121-123.

The wires 121-123 can be attached to the corresponding bond pads using a variety of bonding techniques. To bond a wire to a pad, the wire is placed in contact with the pad surface and energy, such as heat, pressure, or ultrasound energy, and the like, or a combination thereof is applied to the wire, the bond pad, or both. Application of the energy facilitates electron sharing or interdiffusion of the wire and the bond pad, thereby forming an electrical connection.

On example of a type of wire bond is referred to as a ball bond. To form a ball bond, a sphere of wire material or other metal is formed at the end of the wire prior to contacting the wire with the bond pad. In an embodiment, the sphere is formed by melting the end of the wire. After formation, the sphere at the end of the wire is bonded to the bond pad. The wire is then drawn to another bond pad and bonded to form an electrical connection between the bond pads.

In an embodiment, a stud bump (also referred to as a bump or a ball) can be placed on a bond pad to provide enhanced electrical connectivity to a bond pad, and to provide a cushion for the semiconductor material surrounding and underneath the pad, thereby protecting the material. To form a stud bump, a ball bond is formed and bonded to a bond pad. However, rather than drawing the wire to another bond pad, the wire is cut after the sphere is bonded to the initial bond pad, thereby leaving the sphere material bonded to the pad.

Another example of a type of wire bond is referred to as a stitch bond. A stitch bond is formed by bonding a wire directly to a bond pad or bump, without formation of a sphere at the end of a wire. Some bonding equipment connects bond pads according to a defined order, where the wire is bonded to a first bond pad using a ball bond and the wire is bonded to the second bond pad using a stitch bond. Thus, in the embodiment of FIG. 1, the wire 121 is first bonded to the pad 110 using a ball bond, and then is bonded to the bond pad 111 using a stitch bond.

As illustrated in FIG. 1 and FIG. 2, multiple wires are bonded to the bond pad 111 as described further below with respect to FIGS. 3 and 4. In an embodiment, the multiple wires are bonded by stitch bonding each wire over a bump located on bond pad 111. By bonding multiple wires to the bond pad 111, multiple connections are made to the bond pad with a reduced amount of wire material relative to conventional bonding techniques. For example, conventional techniques that provide for only a single wire bonded to a bond pad would require both additional bond pads and the routing of wires through a chip carrier or other device, thereby potentially increasing the size of the integrated circuit device 100. In an embodiment, the multiple wires are bonded such that, at the bond pad having the multiple wire bond, the multiple wires are in physical contact with each other. That is, the multiple wires are arranged in a stack or are otherwise physically in contact (touching).

Figure 3:
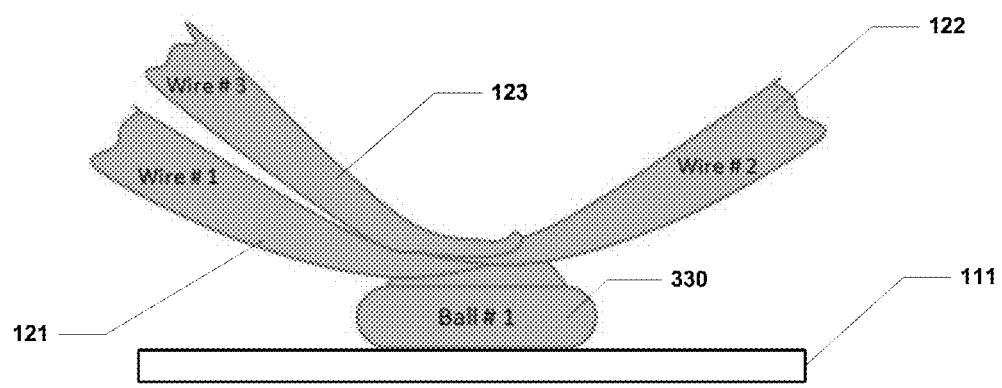
FIG. 3 is a diagram illustrating a wire bond of the integrated circuit device of FIG. 1 in accordance with one embodiment of the present disclosure.

FIG. 3 illustrates a diagram of the bond pad 111 and the associated wire bonds in accordance with one embodiment of the present disclosure. In the illustrated embodiment, a stud bump 330 has been bonded to the bond pad 111. After bonding of the stud bump 330, the wire 121 is stitch bonded to the stud bump 330. Next, the wire 122 is stitch bonded over the wire 121. Finally, the wire 123 is stitch bonded over the wire 122. As a result, each of the wires 121-123 is electrically connected to the bond pad 122. In one embodiment, this completes the electrical connections at bond pad 111. In the illustrated embodiment, the wires 121-123 are arranged such that they are in physical contact at the stud bump 330. In particular, wire 121 is placed over the stud bump 330, wire 122 is placed over the wire 121 (so that is in physical contact with wire 121), and wire 123 is placed over the wire 122 (so that it is in physical contact with wire 122).

Figure 4:
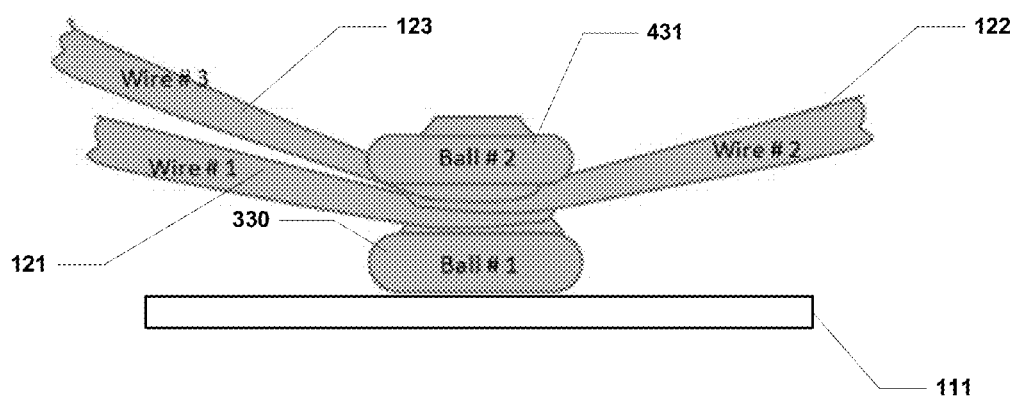
FIG. 4 is a diagram illustrating a wire bond of the integrated circuit device of FIG. 1 in accordance with another embodiment of the present disclosure.

FIG. 4 illustrates a diagram of the bond pad 111 and the associated wire bonds in accordance with another embodiment of the present disclosure. In the illustrated embodiment, the stud bump 330 and wires 121-123 have been bonded in similar fashion as in FIG. 3. In addition, a stud bump 431 has been applied over the stitch bonds for wires 121-123. The stud bump 431 provides security for the stitch bonds, ensuring their electrical connection to the bond pad 111, and protecting the bonded wires from disturbance, such as can result from the movement and operation of wire bonding equipment.

Figure 5:
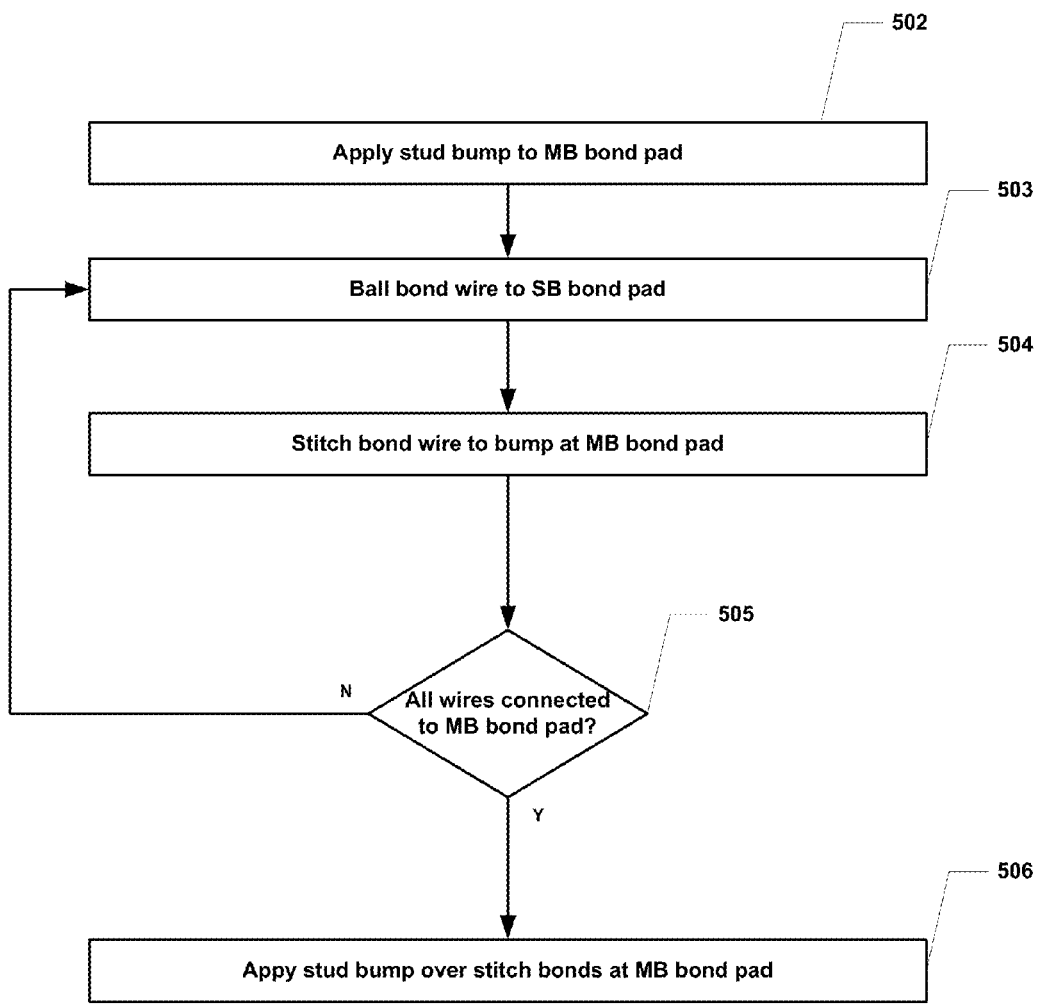
FIG. 5 is a flow diagram illustrating a method of forming a wire bond at the integrated circuit device of FIG. 1 in accordance with an embodiment of the present disclosure.

FIG. 5 illustrates a flow diagram of a method of bonding multiple wires to a bond pad in accordance with one embodiment of the present disclosure. With respect to FIG. 5, the bond pad to which multiple wires will be bonded is referred to as the MB (multiple-bond) bond pad. The bond pads which will only have a single wire bonded are referred to as SB bond pads. Thus, in the embodiment of FIG. 1, bond pad 111 is an MB bond pad while bond pads 110, 112, and 113 are SB bond pads.

At block 502, wire bond equipment applies a stud bump to the MB bond pad. At block 503, the wire bond equipment selects an SB bond pad and ball bonds a wire to the selected pad. At block 504 the wire bond equipment stitch bonds the wire to the MB bond pad, thereby forming an electrical connection between the selected SB bond pad and the MB bond pad. At block 505, the wire bond equipment determines whether all SB bond pads designated to be connected to the MB bond pad have been wire bonded to the MB bond pad. If not, the method flow returns to block 503 and the wire bond equipment selects another of the designated SB bond pads for bonding. If all of the designated SB bond pads have been bonded to the MB bond pad, the method flow moves to block 506 and a stud bump is applied over the stitch bonds at the MB bond pad, thereby providing security for the wire connections at the pad.

Figure 6:
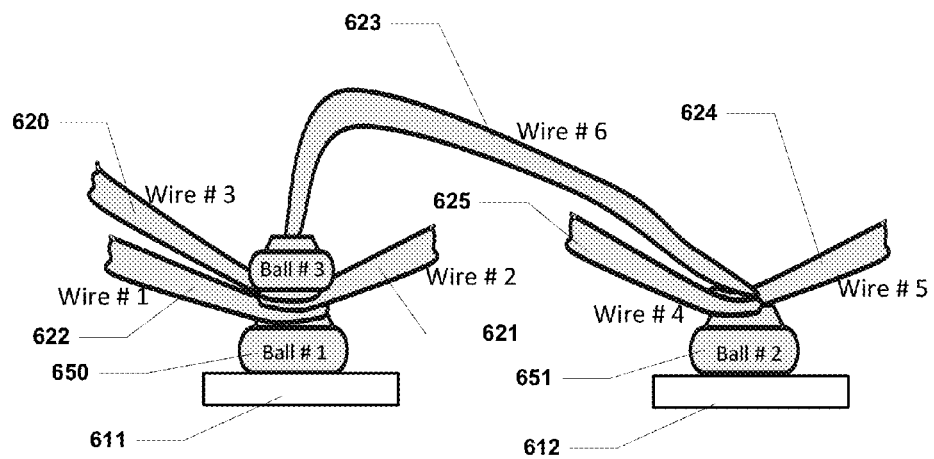
FIG. 6 is a diagram illustrating a wire bond of an integrated circuit device in accordance with another embodiment of the present disclosure.

FIG. 6 illustrates wire bonds in accordance with another embodiment of the present disclosure. In particular, FIG. 6 illustrates that multiple wire bonds can be bonded at each of a plurality of bond pads. Accordingly, in the illustrated embodiment, wires 621-623 are bonded to a stud bump 650 which is bonded to bond pad 611. In addition, wires 623-625 are bonded to stud bump 651 which is bonded to bond pad 612. The wire bonds illustrated at FIG. 6 can be formed as follows: bumps 650 and 651 are applied to bond pads 611 and 612 respectively. Wires 622, 621, and 620 are, in that order stitch bonded to the stud bump 650. Wires 625 and 624 are, in that order, stitch bonded to stud bump 651. Wire 623 is ball bonded over the stitch bond of wire 620 and then is stitch bonded over wire 624, thereby forming an electrical connection between bond pads 611 and 612.

Figure 7:
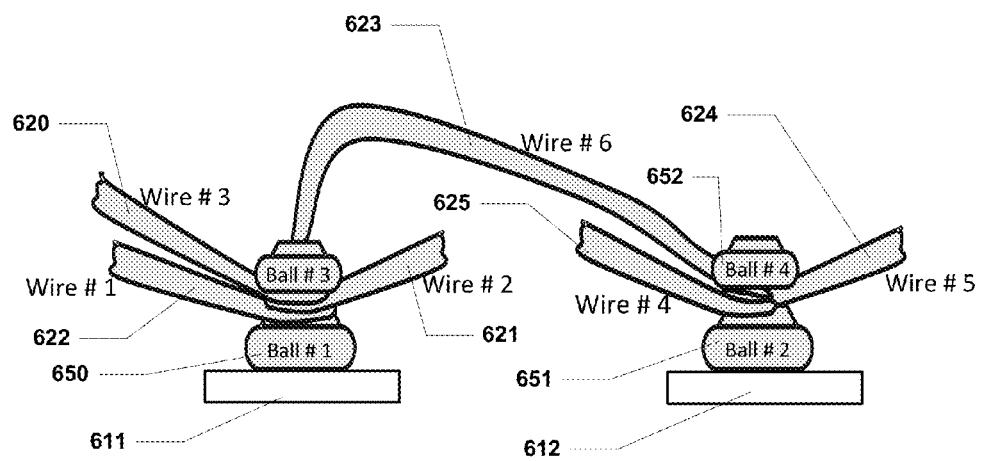
FIG. 7 is a diagram illustrating a wire bond of an integrated circuit device in accordance with another embodiment of the present disclosure.

FIG. 7 illustrates another embodiment of wire bonds in accordance with the present disclosure. In particular, the wire bonds of FIG. 7 are created in similar fashion to those of FIG. 6. In addition, after the wire 623 has been stitch bonded over wire 624, a stud bump 652 is bonded over the stitch bump of wire 623.

Figure 8:
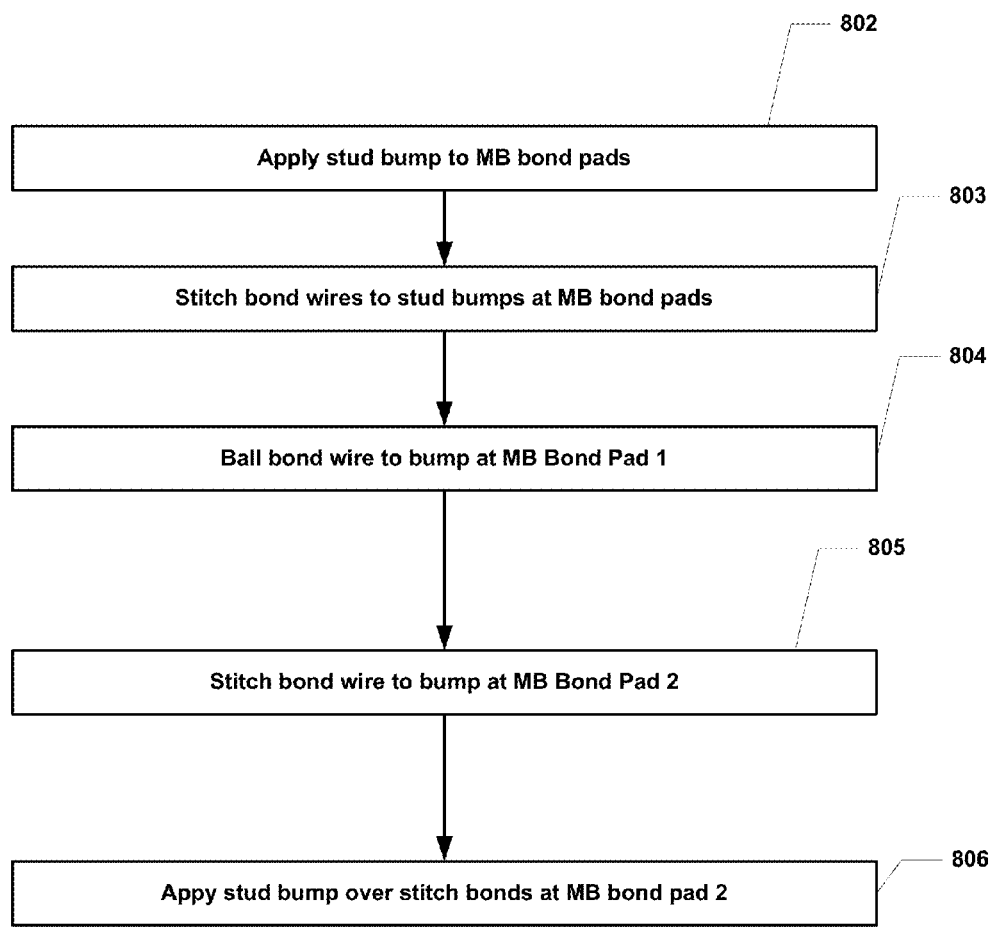
FIG. 8 is a diagram illustrating a method of forming the wire bonds of FIG. 7 in accordance with one embodiment of the present disclosure.

FIG. 8 illustrates a flow diagram of a method of bonding multiple wires to multiple bond pads in accordance with one embodiment of the present disclosure. With respect to FIG. 5, one of bond pad to which multiple wires will be bonded is referred to as the MB (multiple-bond) Bond Pad 1 while the other bond pad to which multiple wires will be bonded is referred to as the MB Bond Pad 2. Thus, in the embodiment of FIG. 7, bond pad 611 is MB Bond Pad 1 while bond pad 612 is MB Bond Pad 2.

At block 802, wire bond equipment applies a stud bump to the MB bond pads (MB Bond Pad 1 and MB Bond Pad 2). At block 803, the wire bond equipment stitch bonds wires to the stud bumps at the MB bond pads. Thus, in the example of FIG. 7, wires 620-622 are bonded over stud bump 650 and wires 624 and 625 are bonded over stud bump 651. It will be appreciated that the stitch bonded wires can have been previously bonded at other bond pads (not illustrated). Thus, for example wires, 620-622, prior to being bonded over the bond pad 650, have each been ball bonded at different bond pads.

At block 804 the wire ball bonds a wire (e.g. wire 623 of FIG. 7) over the stitch bonds at MB Bond Pad 1. At block 805, the wire bond equipment stitch bonds the wire (e.g. wire 623) over the stitch bonds at MB Bond Pad 2. At block 806 a stud bump is applied over the stitch bonds at MB Bond Pad 2, thereby providing security for the wire connections at the pad.

While the above examples illustrate use of first degree polynomials in models, higher degree polynomials can be used. For example, model parameters for first degree, second degree, third degree or higher parameters can be regressed and utilized to determine processing parameters in the manner described above.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise. As used herein, bond pads being substantially the same size means that the size of the bond pads differ by no more than 10 percent.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method comprising:
   bonding a first plurality of wires to a first stud bump on a first bond pad of an integrated circuit device;
   bonding a second plurality of wires to a second stud bump on a second bond pad of the integrated circuit device; and
   applying a third stud bump over the first plurality of wires bonded, wherein at least one wire from the second plurality of wires bonds to a top portion of the third stud bump.

2. The method of claim 1, wherein each of the first plurality of wires and the second plurality of wires comprises at least three wires.

3. The method of claim 1, wherein the applying comprises bonding the at least one wire from the second plurality of wires at the second bond pad and the third bond pad, the first and third bond pads formed at a first semiconductor die and the second bond pad formed at a second semiconductor die.

4. The method of claim 3, wherein the first semiconductor die and the second semiconductor die are arranged in a stacked die arrangement.

5. The method of claim 3, wherein the first semiconductor die and the second semiconductor die are arranged in a side-by-side die arrangement.

6. The method of claim 1, wherein the bonding the first plurality of wires comprises applying the third stud bump over the first plurality of wires at the first bond pad.

7. The method of claim 1, wherein the bonding the first plurality of wires comprises bonding the first plurality of wires to the first stud bump with one or more stitch bonds.

8. The method of claim 1, wherein the bonding the second plurality of wires comprises the second plurality of wires to the second stud bump with one or more stitch bonds.

9. An integrated circuit device comprising:
   a first stud bump on a first bond pad;
   a first plurality of wires bonded to the first stud bump;
   a second stud bump on a second bond pad;
   a second plurality of wires bonded to, the second stud bump; and
   a third stud bump over the first plurality of wires, wherein at least one wire from the second plurality of wires bonds to a top portion of the third stud bump.

10. The integrated circuit device of claim 9, wherein each of the first plurality of wires and the second plurality of wires comprises at least three wires.

11. The integrated circuit device of claim 9, wherein the first and third bond pads are formed at a first semiconductor device and the second bond pad is formed at a second semiconductor device.

12. The integrated circuit device of claim 11, wherein the first semiconductor die and the second semiconductor die are arranged in a stacked die arrangement.

13. The integrated circuit device of claim 11, wherein the first semiconductor device and the second semiconductor device are arranged in a side-by-side arrangement.

14. The integrated circuit device of claim 9, wherein the first plurality of wires are bonded to the first stud bump with one or more stitch bonds.

15. The integrated circuit device of claim 9, wherein the second plurality of wires are bonded to the second stud bump with one or more stitch bonds.

* * * * *